United States Patent [19]

Medwin

[11] Patent Number: 4,459,702
[45] Date of Patent: Jul. 10, 1984

[54] ELECTRONIC VERNIER

[76] Inventor: Albert H. Medwin, 65 Castle Howard Ct., Princeton, N.J. 08540

[21] Appl. No.: 406,655

[22] Filed: Aug. 9, 1982

Related U.S. Application Data

[63] Continuation-in-part of Ser. No. 254,843, Apr. 16, 1981, abandoned.

[51] Int. Cl.³ ............................................... G08C 21/00
[52] U.S. Cl. ........................................ 377/24; 33/1 D; 324/61 R; 377/17
[58] Field of Search ............... 361/280, 290, 296, 299, 361/300; 324/61 R; 364/562, 563; 33/1 D, 125 C; 377/24

[56] References Cited

U.S. PATENT DOCUMENTS 3,789,331 1/1974 Miner et al. ......................... 334/82
4,350,981 9/1982 Tanaka et al. .................. 340/870.37

Primary Examiner—Joseph A. Orsino, Jr.
Assistant Examiner—Timothy K. Greer
Attorney, Agent, or Firm—Robert D. Farkas

[57] ABSTRACT

An electronic vernier measuring apparatus utilizes groups of stationary electrically conductive plates and a movable electrically conductive wide bar carried on a movable substrate. The wide bar is capacitively coupled to a group of stationary commutator-like electrically conductive segments and an elongated conductive strip to provide a greatest capacitance when the wide movable bar is positioned substantially juxtaposed with any one of the stationary electrically conductive plates and a portion of the stationary commutator segments and the conductive strip. Individual plates of sub-pluralities of stationary plates are electrically interconnected to individual plates of adjacent sub-pluralities of stationary plates. Each of the stationary plates and the conductive strip are provided with finger-like portions directed towards each other in axial alignment. An RC oscillator circuit is selectively coupled to each commutator-like segment for a time period, during which each of the stationary plates in a sub-plurality is likewise coupled to the frequency determining input terminals of the oscillator circuit. The frequency of the oscillator is monitored each time an individual stationary plate of a sub-plurality is connected into the oscillator circuit. Vernier measurements are accomplished by comparing the output frequency of the oscillator during changes in measured capacitances, as determined by the location of a plurality of vernier-like disposed narrow movable conducting bars, carried on the movable substrate juxtaposable only over the finger-like portions.

39 Claims, 17 Drawing Figures

ELECTRONIC VERNIER

This application is a Continuation-in-Part of prior U.S. application Ser. No. 254,853, filed Apr. 16, 1981 now abandoned.

BACKGROUND OF THE INVENTION

The Field of the Invention

This invention relates to vernier measuring devices, and more particularly to that class of apparatus utilizing electronic components for the measurements of angular rotation and linear measurements, employed in compasses, resolvers, position and location sensors and encoders.

In particular, this invention relates to an electrical measuring device in which the change in the physical condition of a sensing apparatus is utilized to measured displacements or angular positions. Heretofore, mechanical devices, such as micrometers, calipers, linear scales, amongst others, have been provided with vernier scale elements which require the user to manually and serially perform the operation of determining a rough measurement, and then by consulting the vernier scales, arriving at a more accurate measurement. Invariably, one portion of the vernier scale was movable and positioned adjacent another portion a readable scale, requiring the user to compare their relative positions when making the vernier reading. Such arrangements have been, and are, to a great extent, limited in their effectiveness by the small size of the moving vernier scale and its inherent mechanical accuracy.

It is an object of the present invention to provide a simple arrangement which is extremely reliable and free from extraneous input, providing an error-free measuring device, which does not employ a moving vernier scale element that requires user visualization.

A further object of the present invention is to provide an apparatus which is capable of measuring angular positions or linear displacements, providing an indication thereof to either an electronic visual display, other control devices, or computers, with or without associated visual displays.

Another object of the present invention is to provide an apparatus for the convenience of the user which does not require any visualization of the measurement apparatus, save a remote display portion, if one is employed.

Still another object of the present invention is to provide an apparatus which does not employ moving electrical contacts, by an in between its stationary and movable elements, thereby eliminating wear, friction, and error.

A still further object of the present invention is to provide an apparatus which is insensitive to long term changes in temperature, supply voltage, resistance, and the like.

Yet another object of the present invention is to provide a measuring device which performs its measurements repeatedly, over short periods of time, so as to eliminate drift considerations and the introduction or error thereby.

Yet another object of the present invention is to provide a measurement device which utilizes solid state circuitry for switching purposes thereby eliminating noise, power loss, error, delay, failures, and bulk and weight.

A still further object of the present invention is to provide an electronic vernier measurement device which utilizes a minimum number of leads from its sensor apparatus to obtain resolutions to a high order of magnitude.

Still another object of the present invention is to provide a measurement device capable of utilizing coarser markings than present optical encoders whilts producing an equivalent or higher resolution, thereby reducing cost.

Other objects of the present invention will become apparent during the course of the following description of the accompanying drawings in which.

FIGS. 13(a) to (d) are flow diagrams for various scanning and capacitance measurement routines for various embodiments of the present invention.

Figure 14:
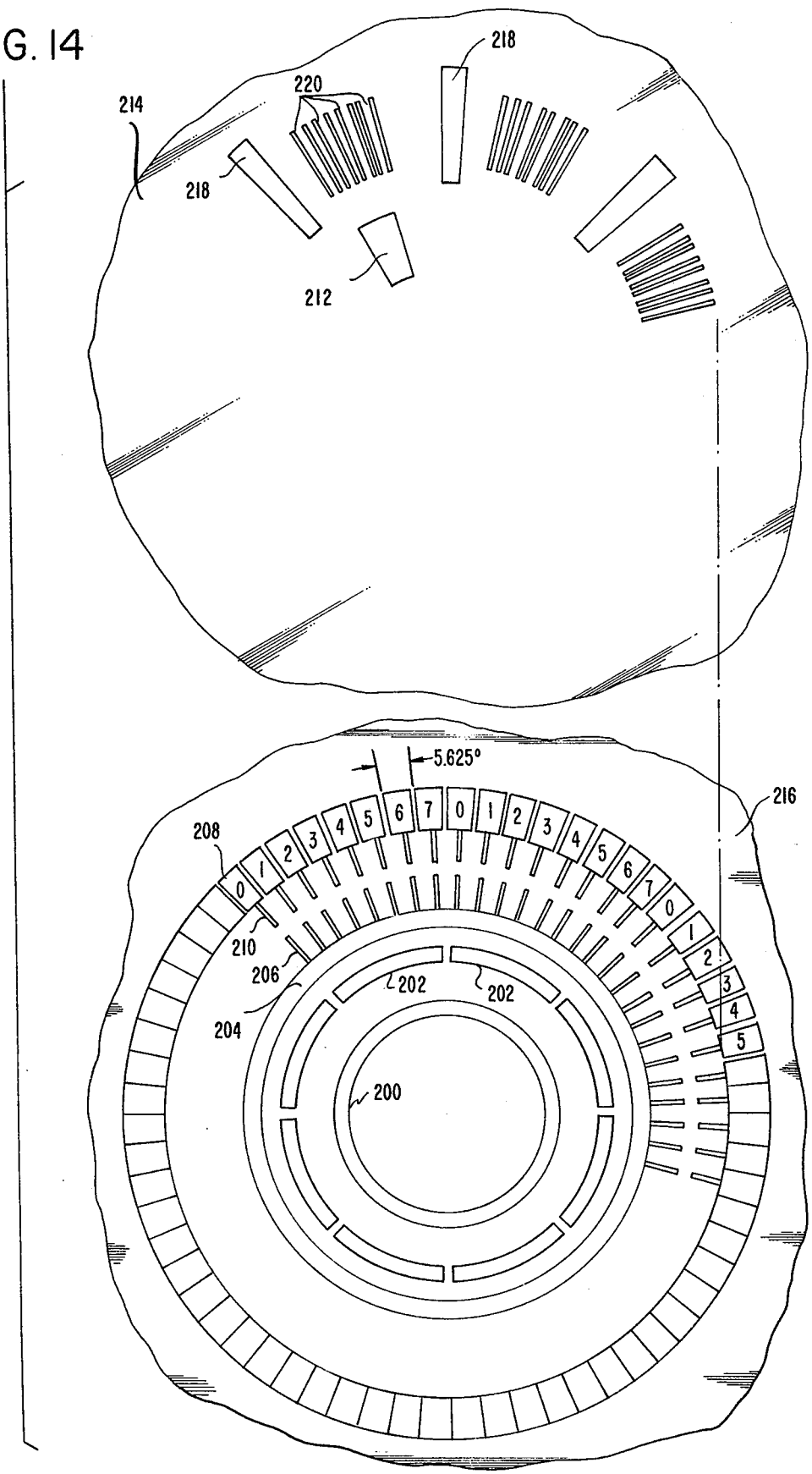

FIG. 14 is a pictorial representation showing electrical conductive components of the stationary and rotational portions of a binary code measurement embodiment of the present invention.

Figure 1:
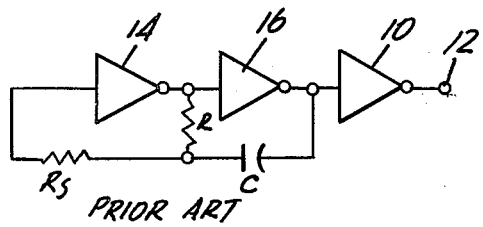
FIG. 1 is a schematic representation of a prior art resistance-capacitance electronic oscillator.

Referring to the Figures, there can be seen in FIG. 1 a conventional, electronic RC oscillator, well known in the art. Inverter 10 acts as a buffer inverter, for output terminal 12 of the device. Inverters 14 and 16 utilize Resistor R and Capacitor C to provide a series of pulses, at output terminal 12, whose frequency is substantially inversely proportional to the product of $R \times C$. Resistor $R_s$ serves as a stabilizing resistor. If capacitor C were to be changed for another value of capacitance $C'$, so as to obtain two series of pulses at terminal 12, each series of pulses would reflect the magnitude of each value of capacitance. The switching circuitry required to substitute the two capacitances, and the time of such substitution, should not affect the frequency of the output pulses obtained when each capacitance has been effectively and completely switched into its operational position. Importantly, when mechanical switching means were utilized, the mass, wearing characteristics, size, friction, and power requirements of such switching mechanism did introduce errors and undesirable results.

Figure 2:
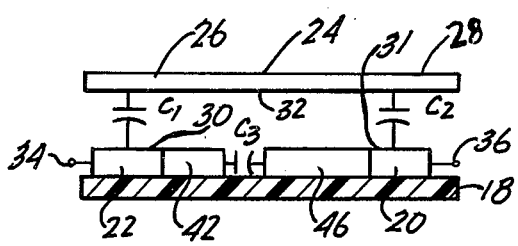
FIG. 2 is a side elevation view of a simplified representation of electrically conductive elements capacitively coupled together.

The apparatus shown in FIG. 2 employs and insulated subtrate 18, utilized to support electrically conductive strip 20 and electrically conductive plate 22 on a surface thereof. Electrically conductive bar 24 is shown positioned over strip 20 and plate 22. Capacitance $C_1$ exists between plate 22 and end region 26 of bar 24. Similarly, capacitance $C_2$ extends between end 28, of bar 24, and strip 20. Capacitance $C_1$ and $C_2$ are determined by the areas of juxtaposition of end portions 26 and 28 and portions of plate and strip 20, respectively. Each of the capacitances $C_1$ and $C_2$ are found to be proportional to the area of juxtaposition of their associated electrically conductive elements, and inversely proportional to the distance separating them, as well as being proportional to the dielectric constant of the dielectric material separating the electrically conductive elements comprising capacitors $C_1$ and $C_2$. Thus, the closer bar 24 is positioned to the uppermost surface 30 of plate 22, and surfaces 31 of strip 20, the greater value of capacitance of capacitors $C_1$ and $C_2$ becomes. Similarly, the higher the dielectric constant of any material interposed between surfaces 30 and 31 and surfaces 32 of bar 24, the higher such capacitances. As used in the present invention, the greater the area of jusstaposition, the higher the capacitance levels attained.

The total capacitance measured between terminals 34 and 36 is a total capacitance obtained by the series circuit arrangement of capacitors $C_1$ and $C_2$. Bar 24 is afforded the ability to move, relative to stationary plate 22 and stationary strip 20. Capacitance $C_3$ symbolizes the fixed stray capacitance of substantially small magnitude, relative to capacitances $C_1$ and $C_2$.

Figure 3:
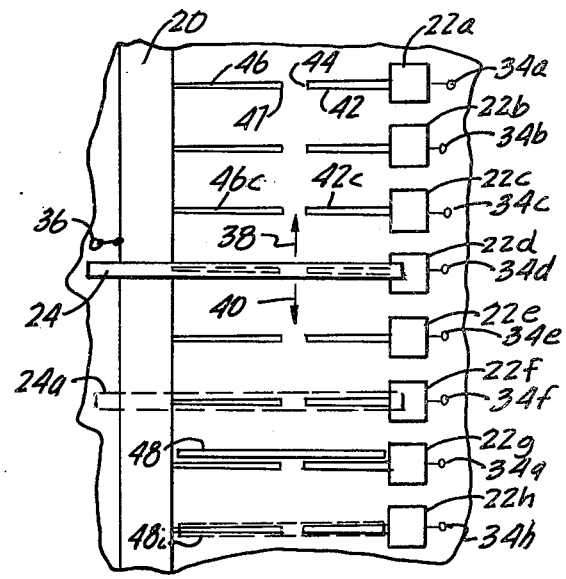
FIG. 3 is a plan view of a portion of the present invention

The apparatus shown in FIG. 3 utilizes elongated bar 24, elongated strip 20, and a plurality of plates 22a, 22b, 22c, 22d, 22e, 22f, 22h. Each plate 22a–h are connected to associated electrical terminals 34a–h. Bar 24 is shown free to move in the directions of arrows 38 and 40, upon the application of an external force being applied thereto, not shown. Dotted lines 24a indicate another location of bar 24, when bar 24 is moved to a position juxtaposed over a portion of plate 22f and another region of strip 20. Finger-like portion or conducting element 42 of plate 22a has end 44 thereof directed towards strip 20. An opposite protrusion or conducting element 46, of strip 20, has end 47 directed towards end 44 of protrusion 42. Each of plates 22b–h are similarly equipped with protrussions or conducting elements. Similarly, additional protrusions are found in opposite locations along the length of strip 20.

Whe bar 24 is positioned as shown, the capacitance measured between terminals 36 and 34d is maximized, because of the additional area of juxtaposition obtained by the finger-like protrusion portions located on plate element 22d and its associated finger-like protrusion of strip 20.

Figures 4, 6:
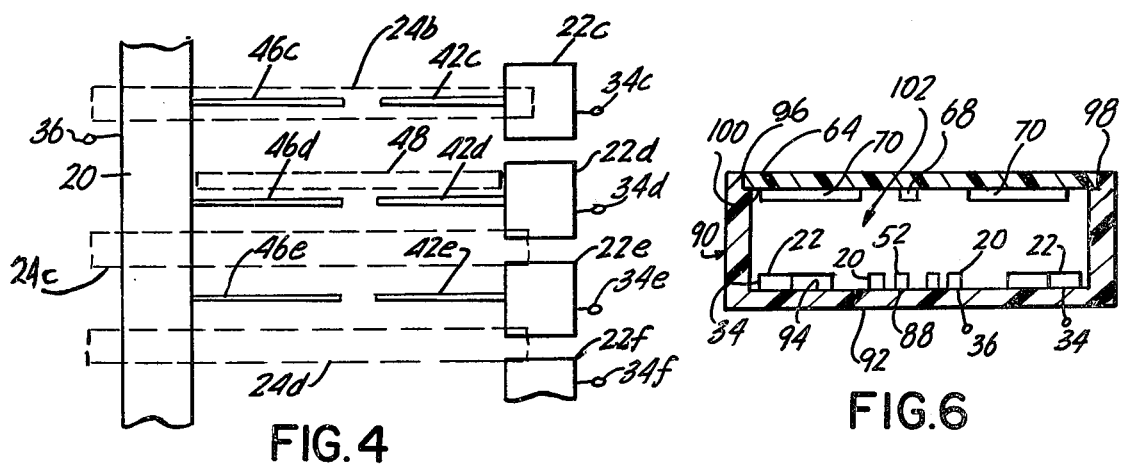
FIG. 4 is an enlarged view of a portion of the apparatus shown in FIG. 3.
FIG. 6 is a cross-sectional side elevation view of a sensing apparatus, utilizable for angular measurements.

FIG. 4 illustrates and enlarged portion of the apparatus shown in FIG. 3, wherein bar 24, as shown in FIG. 3, is now illustrated in three alternate positions 24b, 24c, and 24d, as shown by dotted lines. The capacitance measured between terminal 36 and 34c is at a maximum, due to bar 24b being juxtaposed over a portion of strip 20, a portion of plate 22cf, as well as entirely over finger-like conducting metallic elements 42c and 46c, each being portions of plates 22c and strip 20 respectively.

When bar 24 is positioned in accordance with dotted lines 24c, the capacitance measured at terminals 36 and 34d will be lessened, compared to the position as shown by dotted lines 24b, because of the lessened area of juxtaposition of bar 24 over plate 22. Similarly, the capacitance measured between terminals 36 and 34e will be of a small magnitude. The capacitance available at terminals 36 and 34e will be somewhat higher when bar 24 is positioned in the location shown by dotted lines 24d, than in the case when the capacitance measured at the same terminals when bar 24 is in the position shown by dotted lines 24c. Therefore, it can be seen that the capacitance available at terminal 36 and any of the terminals 34 will range from a lowest value, as shown in the case of dotted lines 24c, to an intermediate range of values, as shown by dotted lines 24d, to a maximum value, as shown by dotted lines 24b. Another bar 48, as shown in dotted lines, is illustrated extending intermediate opposed edges of plates 22d and strip 20. In the position shown in FIG. 4, bar 48 will not substantially affect the capacitance measurable between terminals 36 and 34c or 34d. However, when bar 48 is juxtaposed over elongated finger-like strips 42d and 46d, an increase in capacitance will be detected at terminals 36 and 34d. I have determined that, by judicious design of the size of plates 22 and strip 20, as shown in FIG. 3, in conjunction with the substantial size of bar 24, that the difference in capacitance measured, between full juxtaposition of ar 24, over finger-like elements 46c and 42c, is approximately 30 times higher than the capacitance measured at terminals 36 and 34c, as compared to when bar 48 is positioned directly over elongated finger-like strip 46c and 42c. Bar 24, as can be seen, demonstrates a huge capacitive change between terminal 36 and terminals 34a–h, compared to when bar 48 is in the proximity of plates 22a–h. Bar 48, however, because of its smaller cross-sectional area and decreased length compared to the width and length of bar 24, produces a modest increase in capacitance, across terminals 36 and 34a–h, when bar 48 is positioned juxtaposed over elongate finger-like protrusions 42 and 46.

Figure 5:
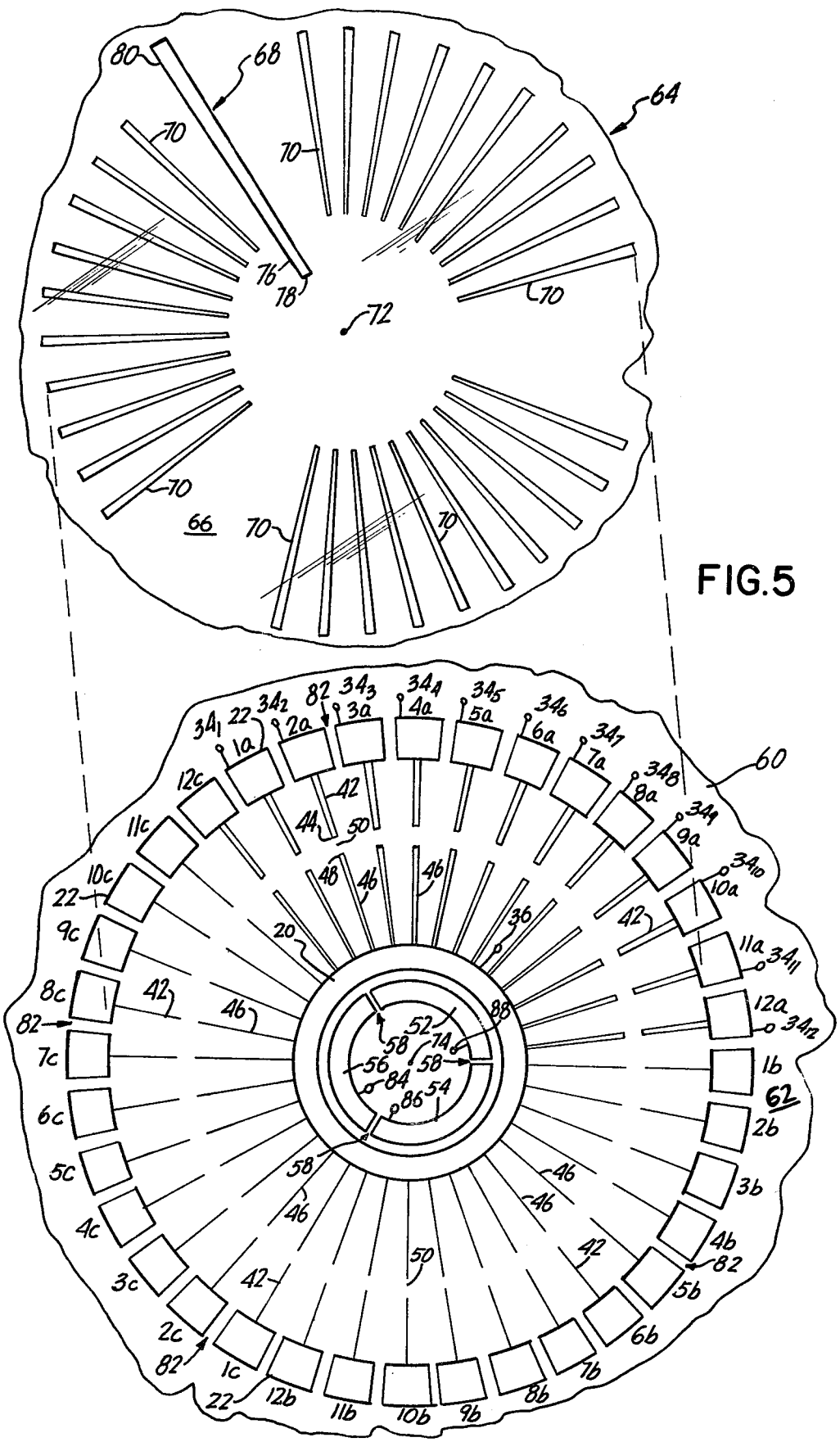
FIG. 5 is a pictorial representation showing electrically conductive components of the stationary and rotational portions of all embodiments of the present invention.

FIG. 5 illustrates a series of thirty-six plates 22, grouped together in individual ranges, or in sets or pluralities of twelve. Each of the twelve plates 22 in each plurality of twelve plates, are labeled serially 1a, through 12a, for a first range or plurality of plates. Another range or plurality of twelve plates are labeled serially 1b through 12b. The remaining range of twelve plates are labeled 1c through 12c. Each of such conducting plates 22 are provided with one of an independent conducting finger-like extensions 42, electrically coupled thereto each shown having a truncated conical shape. Elongated conducting strip 20 is shown in circular-like fashion, and is provided with thirty-six finger-like protrusions 46. Conducting finger-like protrusions or elements 46, also having a truncated conical shape, extend radially outwardly from the periphery of commutator-like annular ring 20 and are axially aligned with opposite finger-like conducting strips 42. It should be noted that there is a slight gap 50 separating ends 44 and 48 of opposite finger-like strips.

Sector-shaped conducting range elements 52, 54, and 56, extend circularly inwardly of annular ring-like strip 20, in coaxial alignment, and are electrically insulated from one another by gaps 58. It should be noted that each of range elements 52, 54, and 56 are disposed to lie in the 120° arcs defined by each group of twelve plates 22, comprising a set of adjacent twelve plates 22, shown consecutively numbered in FIG. 5. Insulating substrate element 60 provides mechanical support and is an electrical insulator for electrically conductive elements 22, 42, 46, 20, 52, 54, and 56.

Disposed over surface 62 of insulating substrate 60 is another plano-parallel plate of insulation, or substrate, such as a plastic material 64. Uppermost surface 66, of plate 64, extends substantially parallel to surface 62. Secured to the lowermost surface of plate 64 are a plurality of electrically conductive elements disposed in radial-like fashion. The longest and widest of such electrically conductive elements, bar 68, of truncated conical shape, has a length substantially equivalent to the innermost marginal edge of annular range elements 52, 54 and 56, extending to the outermost annular edges of plates 22, also shown in FIG. 5. Narrower and shorter radial elements, bars 70, having a truncated conical outline, extend a distance sensibly equal to the outermost marginal edge of annular strip 20 and the innermost marginal edges of plates 22, as shown. Bars 70 may also be characterized as having a lenth substantially equivalent to the length of finger-like conductors 42 and 46, being separated by distance 50. It should be noted that there is only one element 68 disposed on the lowermost surface of insulated mounting plate 64 whilst there may be as many as three sets of ten additional narrower and shorter conducting bars 70, at least one set of ten being required to obtain vernier measurements in decade-like measurements.

Plates 22, elongated finger-like element portion 42, as well as annular strip 20, having its plurality of elongated finger-like elements 46 attached thereto, and including arcuate sections or segments 52, 54, and 56 may be constructed of clad metal laminated on insulating substrate 60. Selected portions of the clad metallic layer of stationary substrate 60 may be fabricated by the process of etching away all undesired areas, so as to leave intact the metallic conducting portions above-described. In this fashion, the metallic conducting elements may be economically and accurately fabricated. The same procedure can be employed in the fabrication of rotatable mounting element 64.

It should be noted that the uniform spacing in between each of adjacent bars 70, shown in FIG. 5, is somewhat less than the uniform angular spacing employed for finger-like conducting elements 42 and 46. As will be later described, the difference in the angular relationship, separating adjacent bars 70 and separating adjacent elements 42 or 46, provides for a vernier scale capability in the measurement technique employing the present invention.

In use, the surface bearing elements 70 and 68, mounted on insulating plate 64, is disposed extending over and substantially parallel to surface 62 of substrate 60. Insulating plate 64 is free to rotate about point 72, being centrally located relative to all conducting elements 70 and 68, each of which extend radially outwardly therefrom. Central point 74 is disposed directly beneath point or origin 72, and is coaxially aligned therewith.

Upon the rotation of insulating plate 64, and upon holding plate 62 stationary, conducting bar 68 has region 76 thereof extending over, in juxtaposed relationship with a portion of annular strip 20. End region 78 of conducting bar 68 is disposed over selected portions of one of arc-like conducting elements 52 or 54 or 56. End region 80 of conducting bar 68, similarly extends over selected plates 22 or partially over gaps 82, shown separating opposed marginal edges of plates 22. Narrower conducting elements 70 may be positioned over finger-like conducting elements 42 and 46, or in those regions extending in between opposed sets of such finger-like conducting elements. The angular relationship between adjacent finger-like elements 46 and finger-like elements 70 are arranged such that for nay rotational position assumed by insulating plate 64, over stationary insulating substrate 60, causes three of conducting elements 70 to be disposed over three of the sets of finger-like conducting elements 42 and 46. It should be noted that though three sets of ten elements 70 are shown, (thereby increasing the total capacitance sensed by similarly lettered plates 22 and being electrically connected to one another—minimizing mechanical construction problems thereby), one set of only ten bars 70 need be utilized as long as they are located adjacent to bar 68. The use of three sets of ten bars 70 minimizes wobble effects that might be experienced between surface 60 and the conducting bearing surface of plate 64.

Bar 24, shown in FIG. 3, is the electrical equivalent of bar 68, shown in FIG. 5, excepting the bar 68 is destined to extend beyond strip 20, and over one of arcuate strips 52, 54, and 56. Narrower conducting elements or bars 70, as shown in FIG. 5, are identical in function and length, as is bar 24, shown in FIG. 3. As can be seen, the twelve plates 22 denominated $1a$ through $12a$, occupy $120°$, its first range. Similarly, plates 22 denominated $1b$ through $12b$, occupy another $120°$, in its second range. The full circle is completely by plates 22 denominated $1c$ through $12c$, in its third range. Electrical connections, not shown, couple together plates 22 that are denominated as $1a$ and $1b$ and $1c$. In similar fashion, plate $2a$ is coupled to plate $2b$ and is coupled also to plate $2c$. In short, all similarly numbered plates are coupled to all other similarly numbered plates by any means well known in the art. The conductors used in such couplings are located remotely from the area occupied by electrically conductive elements 70 and 68. Terminals $34_1$ through $34_{12}$ are coupled to plates 22 in the manner shown. Terminal 36, as shown in FIG. 5, is shown connected to annular strip 20. Terminal 84 is coupled to arcuate conducting strip 56, as is in a similar fashion to terminal 88, for arcuate strip 52. Accordingly, it can be seen that there are twelve terminals 34 ($34_1$ through $34_{12}$) and three additional terminals (84, 86, and 88) for arcuately shaped elements 52, 54, and 56. Accordingly, there are sixteen terminals employed in coupling to all of the active conducting elements shown on surface 62.

The apparatus shown in FIG. 6 describes housing 90 having a base portion 92. Uppermost surface 94 of base portion 92 may be considered to be identical to surface 62, shown in FIG. 5. Accordingly, plates 22, annular strip 20 and arcuate strip 52 are located on surface 94, and are each coupled to their respective terminals 34, 36, and 88. Insulating plate 64 is fabricated so as to have a circular disc-like shape, such that edge 96 thereof resides in shoulder 98, of housing 90. Bars 70 and 68, shown on lowermost surface 100, of insulating plate 64, are disposed in identical fashion to the similarly numbered bars, shown in FIG. 5. Space 102, located between opposed surfaces of the conducting elements secured to surface 100 and to surface 94, may be, as desired, occupied by air, a liquid dielectric, or, if desired, by a solid dielectric material. Suitable liquid dielectrics include oils, alcohol, and a wide variety of low viscosity, high dielectric constant fluids. Deviations in the machining accuracy of housing 90, does not adversely affect the operation of the apparatus, as will be presently understood.

Figure 7:
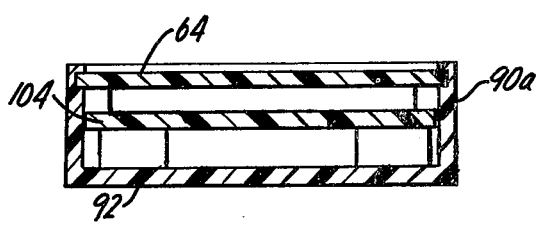
FIG. 7 is a side elevation, cross-sectional view of an embodiment of a sensing element, utilizable for linear measurements, employing a solid dielectric material therewith.

FIG. 7 represents an embodiment of the present invention, in which dielectric material 104 is shown disposed intermediate insulating plate 64 and base plate 92, of housing 90a. Such insulating materials may come into contact with the conducting elements indicated on movable insulating plate 64 so as to create damping losses, and may be a solid insulator, such as polytetrafluroethelene.

Figure 8:
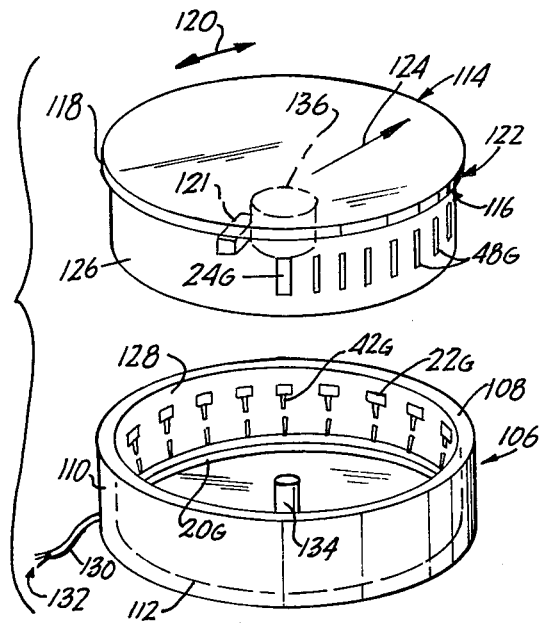
FIG. 8 is a perspective view of a sensing element embodiment of the present invention.

FIG. 8 represents still another embodiment of the present invention in which housing 106 is provided having an uppermost shoulder 108, in annular fashion, residing atop wall portion 110. Dotted lines 112 simulate an uppermost surface of a base portion of housing 106 residing substantially parallel to the plane defined by marginal edge 108. Housing 106 is maintained against rotation, by an convenient means. However, cap member 114 is adapted so that it may rotate, when lowermost surface 116, of rim portion 118, rests upon annular marginal edge 108. Rotation, in the direction of arrows 120 is achieved by applying a tangential force to edge 122, causing indicia-like arrow 124 to point in different directions. Alternately, dotted lines 121, represent a magnet, operable on the earth's magnetic field, so as to generate a sufficient tangential force on cap 114, to cause rotational magnetic alignment. Disposed on vertical cylindrical wall 126 is wide electrically conductive bar 24g and a plurality of separately located, in parallel juxtaposed relationship, narrow bars 48g. It should be noted that cap 114 is fabricated from an insulating material, of any suitable material, such as a rigid phenol compound. Container 106 may be fabricated from the same material and is provided having a plurality of plates 22g, each having finger-like extensions 42g. Strip 20g is similarly mounted on interior cylindrical wall 128. The outermost surface of elements 24g and 48g are spaced apart from the innermost surfaces of elements 22g, 42g, 20g, such that air may be utilized as a dielectric medium thereinbetween. Cable 130 is provided, whose conductors 132 are connected, in a manner not shown, to components 22g, and 20g, as described for the apparatus depicted in FIG. 3 and 4. Pin 134 extends upwardly from the lowermost base-like surface of container 106, and is coaxially aligned with surface 128. Dotted lines 136 describe a socket-like assembly, disposed in the interior portion of cap 114, and utilized so as to center cap 114 about te longitudinal axis of housing 106. If desired, pin 134 may be of such height that surface 116 does not contact marginal edge surface 108, thereby minimizing the frictional contact between such opposed bearing surfaces. Naturally, if desired, a liquid-like dielectric material may be instilled into the cavity of container 106, thereby increasing the dielectric constant and measurable capacitance between elements 22g and 48g with elements 20g and 22g, as well as providing further compass-like support to cap 114 with any desired degree of attendant damping.

Figure 9:
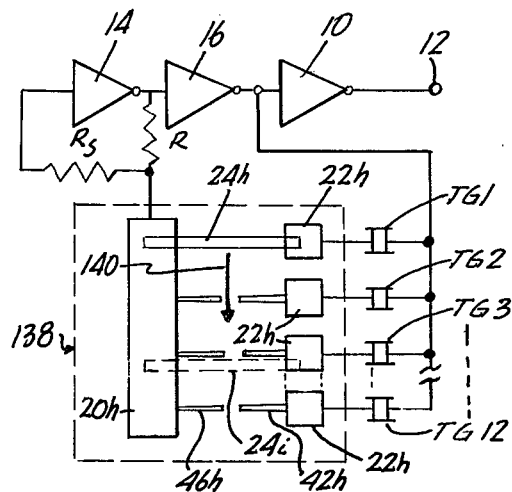
FIG. 9 is a schematic representation of the sensing portion of the present invention coupled to an RC oscillator circuit.

Fig. 9 is a new and novel version of the prior art, shown in FIG. 1, wherein C, as shown in FIG. 1, is replaced by a circuit configuration shown within dotted lines 138 and a plurality switching means, such as transmission gates, each described as TG1, TG2, TG3.....TG12. Pairs of nand gates, not shown in FIG. 9, may be employed for each of the transmission gates illustrated. There are 12 transmission gates in all, each being coupled to an equivalent plate 22h. A bar 24h is shown in solid lines, and is movable to the position shown by dotted lines 24i, when bar 24h is moved in the direction of arrow 140. Strip 20h is maintained in a stationary position, as are plates 22h and their associated protrusions 42h and 46h. When transmission gate 1 is operated into a conducting mode, or switched on, then the capacitance existing between bar 24h, in the position shown, and the uppermost plate 22h and the uppermost portion of strip 20h, will be introduced into the RC Oscillator, such that the output frequency, at terminal 12, will be a function of the capacitance thus measured. In the event TG2 is switched on, then the capacitance existing between the next lower plate 22h and another portion of strip 20h, will be minimal, the frequency of the pulse train available at terminal 12 being extremely high. It can be seen that by sequentially switching on each transmission gate, one at a time, for discrete and separate time periods, will result in several separate series of pulses being sequentially generated at terminal 12, the frequencies of which will be a function of the location of bar 24h and a function of the capacitance so measured. By switching on, in sequential fashion, each transmission gate again, but by failing to switch on the transmission gate that was utilized when the maximum capacitance was measured—reflecting the location of bar 24 over one of the plurality of plates, then, the single bar 48i, shown in FIG. 3, makes a maximum capacitance with finger-like protrusions 42 and 46, also shown in FIG. 3.

Figure 10:
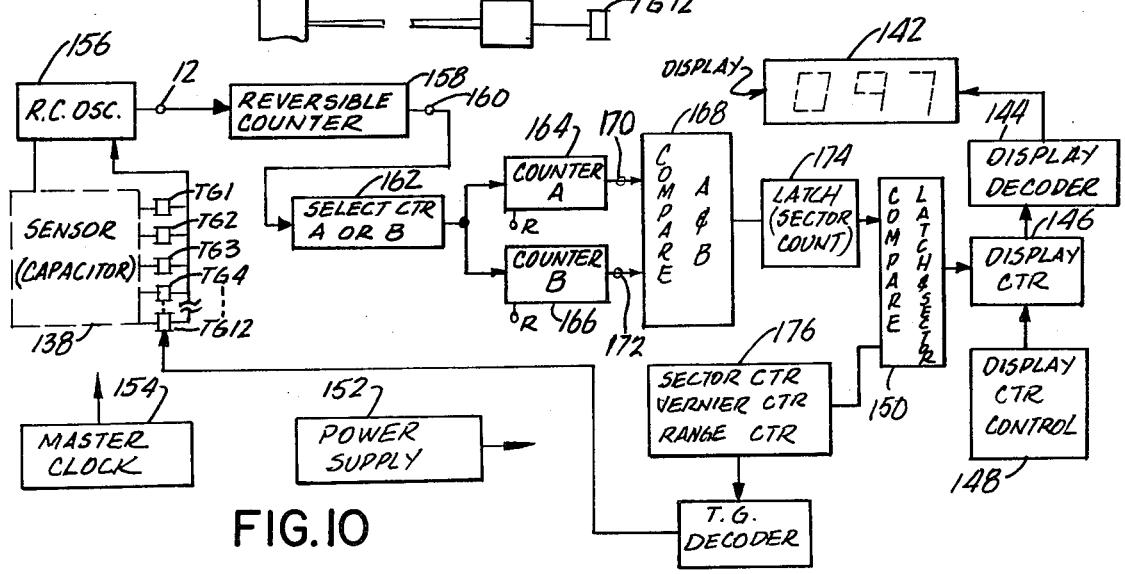
FIG. 10 is a block diagram representation of the circuitry associated with the sensing portions of the present invention.

FIG. 10 illustrates a form of circuitry, shown in block diagramatic form, which is intended to operate with the purely capacitive sensing devices shown in FIG. 3, 4, 5, 5a, 6, 7, and 8. A display apparatus 142 is shown, comprising a numerical read-out, in one of the forms well known in the art. Display decoder 144, display counter 146 and display counter control 148, all operate in conventional fashion, as is well known and are provided with an input signal from a latching sector compare circuit 150.

Power supply 152 may be of the portable variety, utilizing a low current supply. In one model that I have built, a single 9 volt battery, of the type often employed in compact radio receivers, has been utilized and has demonstrated a projected two-year life, for the continual use of the apparatus. Master clock 154 is provided, which produces an energizing gate signal for transmission gates TG1 through TG12, though only five transmission gates are depicted. Dotted lines 138, as shown in FIG. 10, contain the elements shown within the boundaries of dotted lines 138, in FIG. 9.

Block 156 depicts an RC Oscillator, comprising the remaining elements shown in FIG. 9, other than transmission gates 1 through 12, and the capacitance measuring devices shown with dotted lines 138. It may be desired to sense for a higher frequency, rather than a lower frequency. Reversible counter 158 may be coupled to terminal 12, the output terminal of RC Oscillator 156. Reversible counter 158 serves the purpose of providing a higher count, when the location of bar 24h is being detected by selectively and sequentially energizing transmission gates 1 through 12, as in FIG. 9. Logic circuitry, well known in the art, can be employed such that less than the total of all transmission gates may be sequentially operated, so as to skip over selected potential capacitance measurements, when desired. Further, if desired, selective transmission gates may be operated counter to the direction in which selected the plurality of transmission gates had been previously operated. Thus, at terminal 160, a high count will be present when the corresponding transmission gate, shown in FIG. 9, is operated, having bar 24b being located adjacent such transmission gate's associated plate 22h. However, reversal counter 158 may be deleted and sensing can take place for the lowest frequency, rather than the highest frequency.

In operation, as shown in FIG. 9, the bar depicted by dotted lines 24i, is over portions of strip 20h and the third from the uppermost plate 22h—located adjacent the third transmission gate, TG3. Defining each transmission gate and its associated plate and portion of strip 22h and 20h respectively, as a sector, then for the position shown by dotted lines 24i, "sector 3" will demonstrate the highest capacitance. (A sector number corresponds with its associated transmission gate number, i.e. sector 4 utilizes transmission gate TG4.) Since the RC Oscillator's frequency is inversely proportional to capacitance, the output frequency would be lowest when the sector counter is at a count of 3, or put another way, when transmission gate 3 is operational. It should be noted that all of the elements utilized by RC Oscillator 156, save for the transmission gates 1 through 12 and the location of bar 24h, is used on a time shared basis without change. Thus, the only variable to be measured will be the capacitance associated with each sector as the sectors are sequentially selected during a range or cycle of twelve sequential counts, there being twelve sectors. When bar 24i is at the third sector, the capacitance between strip 20h and the plate 22h, of the third sector, will be the highest, resulting in the frequency available at terminal 12 being the lowest of all of the remaining eleven sectors. The position of bar 24h is detected by monitoring the RC Oscillator frequency for the specific count which energized the transmission gate resulting in such lowest frequency. Naturally, the frequency available at terminal 160 is highest for the transmission gate—sector which detects the location of bar 24h.

Figure 11:
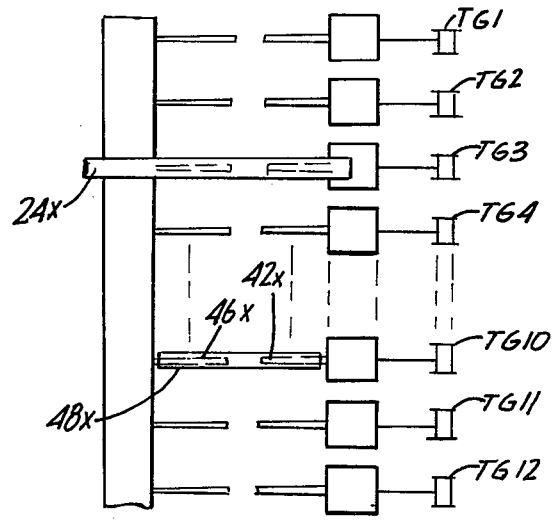
FIG. 11 is a plan view of the electrically conductive portions of an embodiment of a sensing device employed in the present invention for linear measurements.
Figure 12:
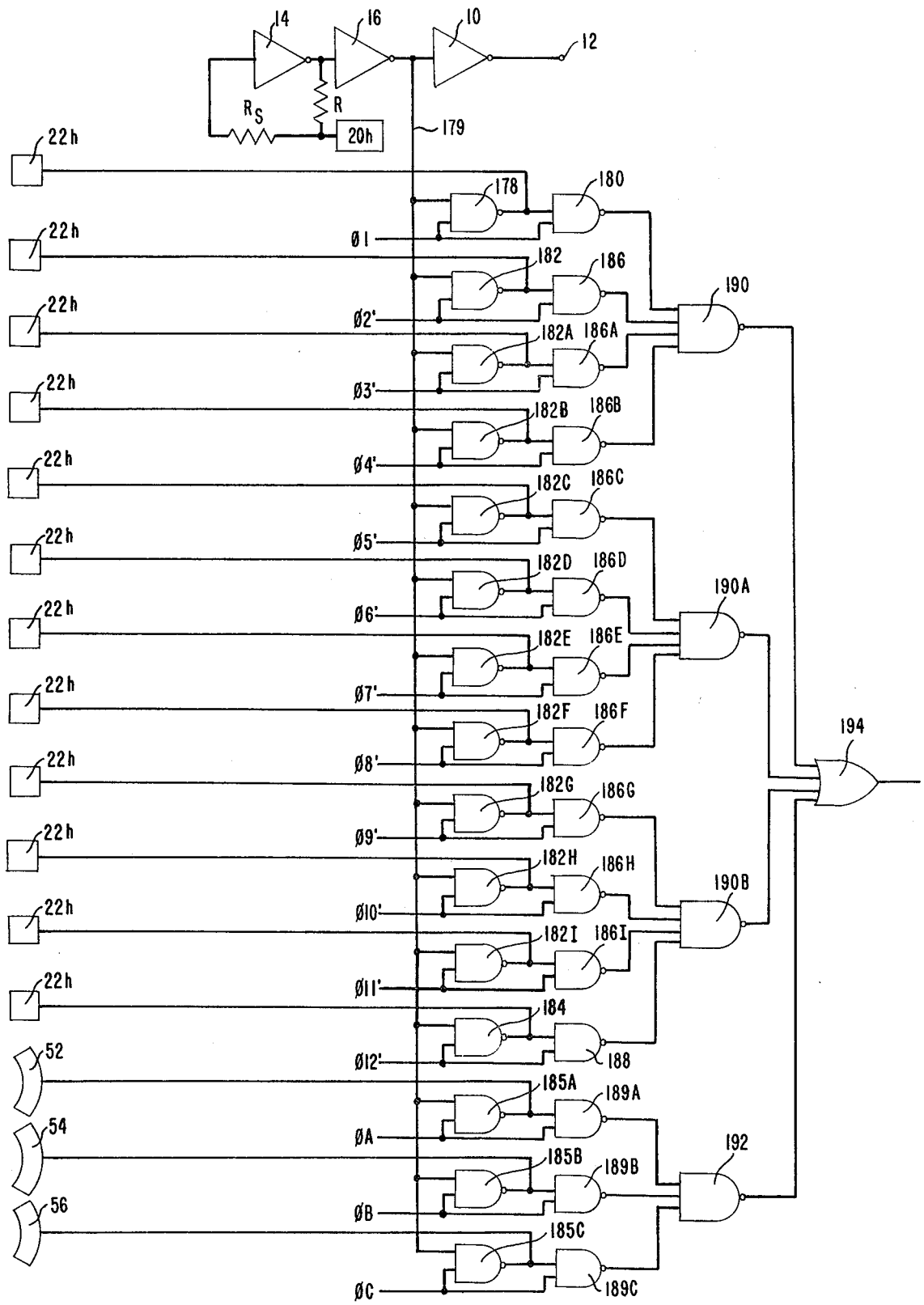
FIG. 12 is a schematic representation of an alternate embodiment of portions of the present invention shown in FIGS. 9 and 10.

The transmission gates shown in FIG. 9 and denominated TG1-14 TG12, as well as those shown in FIGS. 10 and 11, may be individually replaced by pairs of nand gates, as shown in FIG. 12. Nand gate 178 operates so as to connect uppermost plate 22h to the juncture of inverter 16 and the input of buffer inverter 10, at point 179. In a manner well known in the art, when nand gate 182 is operated, next lowermost plate 22h is similarly alternately coupled to the same location. The outputs of nand gates 180, 186, 186A–186I, and 188 control the outputs of nand gates 178, 182, 182A–182I and 184. In a manner well known in the art, when nand gate 185A is operated, sensing plate 52 is coupled to point 179. In similar fashion, nand gates 185B and 185C couple plates B and C to point 179. Nand gates 180, 186, 186A–186I and 188, in a manner well known in the art, serve as the equivalent of the transmission gate decoder, shown in FIG. 10. Similarly, nand gates 189A–189C serve to decode the control signal for 185A–185C. Nand gates 190, 190A, 190B, 192, and 194 serve to gate the outputs of nand gates 180, 186, 186A–186I, and 188, as well as nand gates 189A–189C. If desired, all nand gates shown in this figure may be replaced by NOR gates. Points 01' through 012' and points 0A through 0C are connected to timing outputs from the sector counter decoder shown in FIG. 10. The circuit shown in FIG. 12 is typical of the circuitry that may be employed for a twelve sector count arrangement in conjunction with the three supplementary range sectors, if desired.

The inherent constructional characteristics of the apparatus, comprising the capacitance sensing elements of the present invention, may result in minor variations in capacitance being measured for one set of plate, bar, strip configuration over another, such that the capacitance will vary slightly for each set of elements employed. By insuring that the area of juxtaposition of the portions of bar 24h, shown in FIG. 9, over strip 20h and over plate 22h, are extremely large, relative to stray capacitance, wiring capacitance differences, variations in art work, etching, and the like, is to insure that the capacitance measured for an actual juxtaposed position is substantially greater than small variations encountered between adjacent or nearby elements. In short, the capacitance of bar 24h, shown in FIG. 9, is huge, when in the position shown by dotted lines 24i, as in FIG. 9; or by dotted lines 48i, as in FIG. 3, compared to the minor capacitances measured for all other opposed plate-strip pairs. In those cases when only a corner of bar 24h is over a corner or portion of any plate 22h, the total capacitance measured in a sector comprising such plate 22h will, by the selection of the distances and size of plates and bar, be substantially higher than the capacitance generated as stray capacitance or related to minor changes in capacitance due to inherent constructional differences or the environment.

Block 162 operates in conventional fashion, so as to alternately select counter A, block 164, or counter B, block 166. In operation, the raw oscillator frequency from the RC Oscillator steps reversal counter 158 from zero to a pre-selected value, such as 1024 ($2^{10}$). This action occurs for each sector count or for each time period that each transmission gate is energized. The lower the frequency, the longer in real time it takes for the count to each 1024. Fixed rate pulses, from master clock 154, commence from the time that RC Oscillator 156 turns on for each new sector, until a count of 1024 is reached in reversible counter 158. For a lower frequency, a greater number of master clock pulses will be utilized. Thus, for the position of bar 24, shown by dotted lines 24i in FIG. 9, the capacitance is greatest, the RC Oscillator 156 frequency is lowest, and the greatest number of clock pulses are gated into select counter shown by block 162.

Counters 164 and 166 have their output terminals 170 and 172 respectively, coupled to the input of compare circuit 168. Before the first sector (TG-1) is operated, both counters 164 and 166 are reset to a zero position, in a manner well known in the art. The pulse train, occurring during the sector 1 count is directed to counter 164. Its value must be higher than the zero present at this time in counter 166 (the count in counter 166 being zero). If this be the case, a sector count, obtained during counting of sector 1, is stored in latching circuit 174. When TG-2 is energized, the sector 2 count commences, the pulse train output from terminal 160 is fed then into counter 166. The second count, if less than the first count, will result in no latch being made in latch (sector counter) 174. It should be noted that the first count has still remained stored in counter 164 during the comparison period. Counter 166 is then reset to zero and the next sequential pulse train, obtained during the measurement of sector 3, is fed to counter 166 for comparison with the pre-stored count in counter 164. Because bar 24i is located in sector 3, the pulse train obtained during the switching on of TG-3 will be substantially higher than the count presently stored in counter 164. At this time, the sector count of sector 3 is stored in latch 174. Counter 164 is reset to zero and the next successive pulse train (sector 4 train) is fed into counter 164. The fourth count would now be compared with the existing high count in 166 which has retained the highest previous count (of count of sector 3). Presuming that bar 24i remains in sector 3, sector 4 will result in a lower count, such that counter 164 is reset again in preparation for the next pulse train. The remaining eight pulse trains, generated during operation of sectors 5 through 12, will all result in individual sector counts substantially less than the count obtained during the switching on of sector 3.

It is obvious that other circuit configurations, such as those involving multiple counters and multiple latch circuits could, for example, eliminate the need for multistage counter A and multistage counter B.

After a complete cycle of twelve sector counts has been completed, the sector with the highest pulse count has been identified by its individual sector number, being available in latch 174. The output of the latch (the stored sector count) 174, provides a numeral to be displayed equal to ten times the sector number which sector contains bar 24. In the example used, the count fed to display 142 would be 30 (3×10). At the completion of a total of twelve sector counts, the sector counter portion of block 176, instead of being reset to a zero count, is advanced one count, so that the next ten sectors may be examined. The purpose behind this approach is to keep the vernier operation of the apparatus separate and apart from the sector measurement phase of the apparatus, as defined by the location of bar 24i. Thin bar 48, shown in FIG. 3, provides a small change in capacitance, when such thin bar is positioned over protrusions 46 and 42, as shown in FIG. 3. Since the capacitance in each sector is determined either by the location of bar 24i, as shown in FIG. 9, or by fine bar 48, as shown in FIG. 3, then it is highly desirable to isolate the capacitance swamping effect that might be felt when attempting to measure the location of thin bar 48 from the actual location of bar 24i. Vernier counting commences at a location one sector away from the adjacent sector to the sector containing bar 24i. This "empty" or unused or skipped sector serves to prevent swamping of the capacitance effects generated by bar 24i on fine bar 48. More than one sector can be skipped as desired.

The vernier operation of the solid state circuitry depicted in FIG. 10 is the same in operation as is the circuitry employed for detecting the presence of bar 24i, as shown in FIG. 9, excepting for some variations. In this embodiment there are twelve sector counting steps, one for each transmission gate and associated plate 22h. In the vernier operation, only ten sectors are compared. The reason for this is to obtain a decimal or decade equivalent for angular measurements, when measuring the location of fine bar 48, in a vernier-like relationship. Many conventional mechanical vernier apparatus may utilize nine vernier indicia marks, each being located nine/tenths of the distance defining the main associated scale elements.

The present invention should not be construed to be limited to a fixed number of indicia marks, being located at nine/tenths of the distance defining the main associated scale elements. Other variations are possible, such as, eight indicia marks being located at seven/eighths of the main associated scale element distance, thus describing another form of vernier, most suitable when providing a binary code output - from the apparatus described herein.

Another difference, when making the vernier measurement in the present invention, over the sector measurement, is that the count starts at the conclusion of the sector measurements, where the sector counter portion of Block 176 has been incremented to equal the number stored in latch 174, plus one additional count.

When commencing a vernier measurement cycle, the sector counter has been incremented to equal the number stored in latch 174 plus one count, and with counters 164 and 166 reset to zero. On the first count, when seeking to determine the location of fine bar 48, shown in FIG. 3, the first count - as in the example employed above—in sector 5, will result in a pulse train going to counter 164. The value of such count will obviously be higher than the now zero count existing in counter 166. The sector count, representing energizing TG-5 (or its nand gate replacement) is stored in latch 174. During the second count of the vernier cycle, now when TG-6 (or nand gates, if utilized) is energized, the output pulse train available at terminal 160, is fed into counter 166. If this count is less than the first count, still being held in counter 164, then no latch is made, counter 166 is reset to zero, and the next upcoming pulse train (sector 7 - TG-7) would be fed into counter 166. This process would continue until all of the ten counts of a ten step vernier counting cycle is complete.

With the onset of the fifth count of the vernier cycle counting sequence, the vernier count occurs during the energization of TG-10 (or its nand gate equivalent). Here, as shown in FIG. 11, vernier fine bar 48x is juxtaposed over protrusions 46x and 42x. This means that sector 10 will reflect the highest capacitance. Thus, the count in counter 166 will be higher than the count in counter 164. The count experienced during sector 10's count will be retained since it is presently the highest vernier count. Presuming that the fine vernier bar 48x will not move, then the next succeeding count, obtained on the energization of TG-11, will result in a count that is lower, causing counter A, or Block 164, to be reset in preparation for the next succeeding pulse train.

At the conclusion of the ten vernier counts, the comparison stops and a signal is transmitted to display 142. It should be noted that the output pulses generated during the fine vernier measurements are not multiplied by ten, as before, such that the display now includes fractional digits (in the form of whole numbers) which are additive to the digits previously stored representing coarse measurements.

For the embodiment illustrated in FIGS. 5, 9, and 12, the range measurement defines in which 120° arc bar 68 resides. Similarly, bar 68 defines each 10° sector measurement during the twelve sequential sector capacitance measurements. Finally, during the ten vernier measurements, employing bars 70, the vernier measurement is accomplished with a one degree resolution, one degree being a fraction of ten degrees.

In encoder applications, the speed of data acquisition is important. The present invention requires that once a sector has been established by sequencing all twelve sectors, it is then necessary to determine the juxtaposition of fine vernier bar 48 for a substantial number of counts, such as ten of the twelve sectors. Each readout requires the RC Oscillator to load up to a fixed number of counts into counter A (block 164) and counter B (Block 166)—as shown in FIG. 10. Presuming each such count is 1024, for each of the twelve sectors, ten vernier measurements results in 22×1024 pulses—for a total of 22,528 pulses. Presuming that the desired data acquisition rate is 10,000 1 reads per second, a typical pulse width would be approximately 4.4 nanoseconds in real time. Accordingly, the RC Oscillator and associated circuitry, would be compelled to operate in approximately the 220 megahertz region. In order to minimize the frequency requirements of most of the solid state circuitry components to be employed, it should be recognized that the moving portions of the various embodiments of the present invention cannot physically move from place to place, either linearly or rotationally, any significant amount, within such short time periods. In many applications, once the sector has been established during a given cycle, it will either be the same during the next cycle or it will be one sector higher or one sector lower. Accordingly, in most applications it will only be necessary to read three sectors, instead of twevle, once the maximum capacity involving bar 24, shown in FIG. 11, has been established. If this be done, the total number of capacitance measurements would then only be three plus ten, or thirteen, instead of twelve plus ten, or twenty-two. If this be the case, the approximate maximum frequency required to be utilized would be 130 megahertz. In the same fashion, the vernier measurement can be reduced as well from ten in number to three in number, resulting in a total of six measurements, instead of the full twenty-two, or thirteen. If this be the case, the maximum operating frequency would be approximately 60 megahertz. If it is desired, the full twelve sectors and the ten vernier measurements can still be read in parallel—such as by using another counter A and counter B and associated compare circuits—and its results compared with the pairs of "three quick" capacitance readouts before the final achieved output of the device is strobed and the apparatus made ready for the next measurement cycle.

Arcuate conducting segmented strips 52, 54, and 56, shown in FIG. 5 represent a portion of the present invention, used in grouping twelve sets of plates 22 together, into three 120° segments of a circular pattern or into three separate ranges of sectors. When the leftmost end of bar 24b, shown in FIG. 4, is permitted to extend over any one of arcuate strips 52, 54, or 56, a capacitance is measured thereinbetween which can be utilized, by identical circuitry above-described, as the range counter portion of Block 176, to provide an additional count of either 120° or 240° into display counter 146, thereby describing the location of bar 24b, around its circular path, as shown in FIG. 5. It may be deirable in some applications to measure each time 360° of rotation has been completed, as well as sensing the direction of each turn comprising 360°. In this fashion, clockwise and counter-clockwise turn counts can be accumulated in numerical form. By selecting a single interspace 58, shown in FIG. 5, as being zero degrees, and by determining arbitrarily that arcuate plate 52 covers the range of 0 to 120° and conversely, arbitrarily determining that arcuate plate 56 measures 240° to 360°, then, the location of the range position may be taken from the first digit counter, (which will contain a count of zero or one or two or three). Similarly, it can be determined if the wide bar 78 is in the sector measured by arcuate plate 52 or arcuate plate 56. If the initial count was determined by arcuate plate 56, proceeding in the direction of arcuate plate 52, the movement may be considered clockwise and, as measured, may be added to a clockwise counter, which counter measures multiple turns in the clockwise direction. Conversely, if the initial location of the leftmost end of bar 24b is over arcuate plate 52, and then found to proceed directly over arcuate plate 56, the movement can be considered counterclockwise and the counterclockwise counter, not shown, would store an additional count of one. It is obvious, that one counter could be used, indicating multiple turns, which may also be provided with a plus sign indicator for clockwise rotation and a minus sign for counterclockwise rotation, all in a manner well known in the art. Multiple turn measurements are useful in the utilization of the disclosed rotational encoder, especially when being utilized as a linear measurement device for measuring an extended or long range. The rotational encoder, accompanied by a multiturn readout would prove to provide measurements over any distance, limited only by the counting capability of a multiturn counter not shown.

Figure 13:
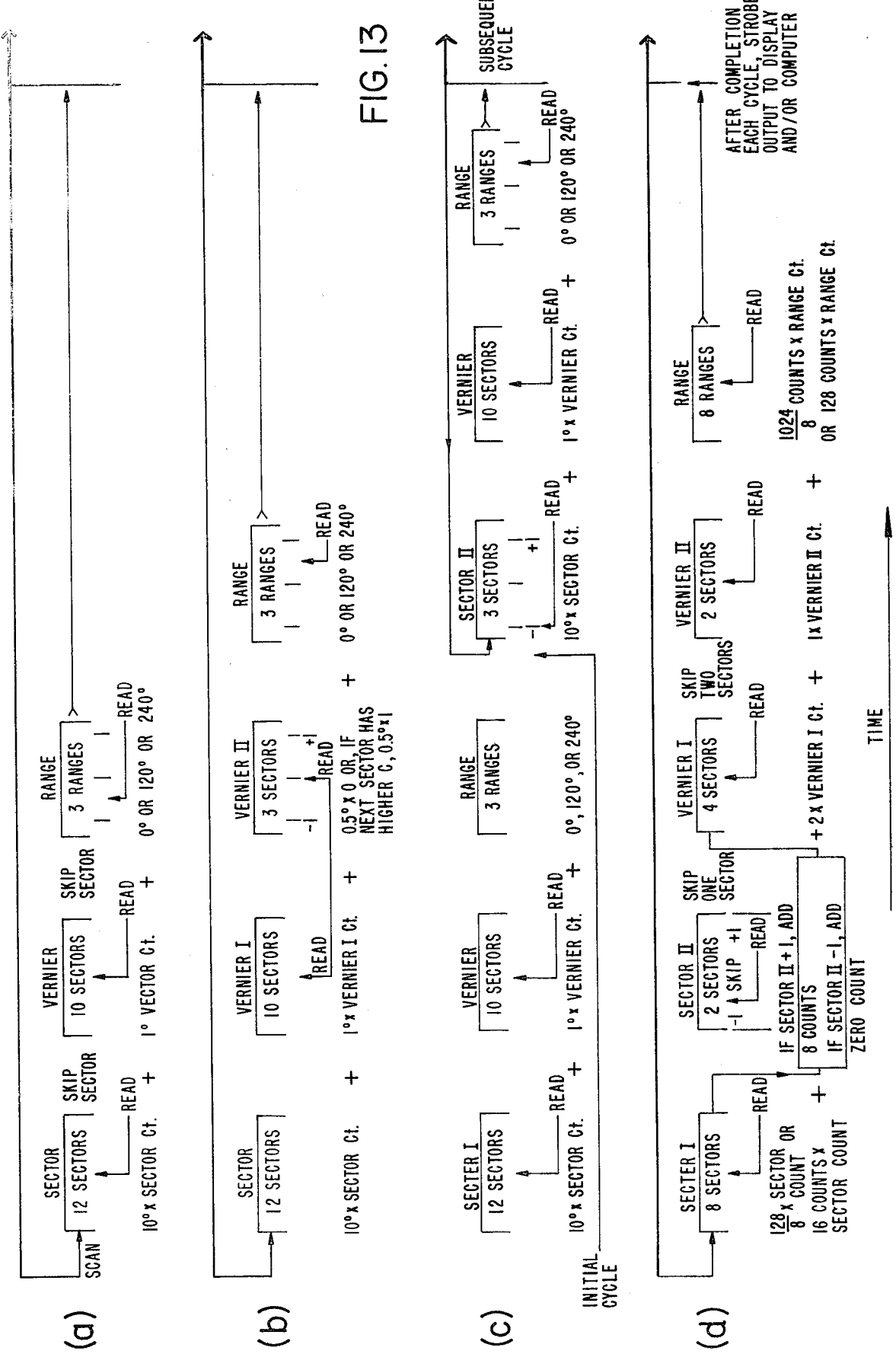

FIG. 13(a) depicts the measurement techniques in the digital vernier apparatus, described in FIGS. 5 and 10. FIG. 13(a) indicates the measurements of the twelve sectors obtained by scanning each of them, and determining the maximum capacity between bar 68 and plates 22, wherein there are welve plates 22 in each of the three ranges. A count of ten degrees times the value of the numerical value assigned to each of the twelve sector plates is stored. Thence, scanning occurs over ten sectors, skipping the first and last thereof, to accomplish a vernier count. Such vernier count, being numbered one through ten, is multiplied by fractional one degree, and then added to the sector count. The range count, comprising three ranges that are scanned, requires the addition of 0°, or 120°, or 240°, providing thereby a maximum total count of 360°. This sequence provides a scanning routine of sector, followed by vernier, followed by range scannings. Alternatively, a range scan can be arranged first, followed then by a sector and a later vernier count. At the conclusion of all sector, vernier and range scans, the output is strobed, to a display or computer, not shown. The next series of sequential measurements, in any order, can then immediately take place.

Useful in finer resolution of angular or linear measurements is the technique employed by that shown in FIG. 13(b). Here, the sector, vernier I and range counts are equivalent to that shown in FIG. 13(a). Vernier II is utilized, in addition, so as to obtain a finer vernier resolution. Here, simply by selecting the order in which the transmission gates or nand gates are activated, an additional vernier sweep is utilized (vernier II), comparing the amount of overlap of the capacitive elements for the sector measurement following and the sector measurement preceding the vernier segment that was previously selected as having maximum capacitance between juxtaposed metallic elements. For example, if fingers 44 and 48, corresponding with sector 2a, shown in FIG. 5, makes the maximum capacity with a bar 70, then such vernier segment (2a) is the selected vernier I readout. Another sweep is made, for the two vernier elements on each side of the vernier finger-like elements associated with segment 2a. Comparison of the overlap of the finger-like elements of sector 1a and sector 3a is then made. The two adjacent sectors capacitances are measured, relative to the central sector, the highest of such two adjacent sector capacitance readings results in an increase of the resolution to ½ degree.

FIG. 13(c) illustrates the ordinary sector I count, wherein the twelve sectors are scanned sequentially, in a search for the sector making the maximum capacitance as herein above described. Following such scan, the ten sectors are scanned in the vernier mode. An intermediate strobe occurs, such that the output of the apparatus to the visual display or to a computer, is disposed of. On the next sector scan (sector II), a sweep of three sectors is centered about the sector plate previously selected as having the maximum capacitance. This eliminates nine unnecessary sector plates to be measured, based on the assumption that it would be impossible for the encoder to move more than one sector away between adjacent scans. If such be the case, the highest of the three sectors scanned in this sector scan (sector II), is used in conjunction with the ten sector scan in the following vernier scanning mode followed by the range scan before subsequent strobes are effectuated similar to as shown in FIG. 13(a).

FIG. 14 illustrates a metallic conductive pattern, used on a stationary substrate and movable elements located on a rotational encoder useful in producing a binary output code as opposed to a decimal code. Portion A, of FIG. 14, is the stationary portion of the apparatus, consisting of central annular ring 200, about which are disposed eight arcuate rings 202, each being insulated from one another and disposed radially, in coaxial alignment with annular ring 200. Annular ring 204 is disposed radially outwardly from annular ring segments 202 and have finger-like projections 206 emanating, in fan-like fashion, outwardly therefrom, in equi-spaced relationship. Ring 200 may be electrically coupled to ring 204. Alternatively, ring 200 may be deleted provided that wide bar 202 is dimensionally positionable over selected portions of ring 204 and segments 202. There are eight finger-like protrusions 206, in arc subtended by each arcuate portion defined by rings 202. Sector plates 208 and their associated inwardly directed finger-like protrusions 210, extend radially inwardly towards annular ring 204, there being eight plates 208 corresponding with eight finger-like protrusions 206, in radial alignment. Every eighth plate 208, is coupled electrically together. Rotational plate substrate 214, shown in portion B of FIG. 14, carries wide bar 212, of a conducting material, on the portion thereof juxtaposed with substrate portion 216, carrying metallic elements 200, 202, 204, 208 and protrusions 206 and 210. Wide bar 212, is disposed coupled over portions of annular ring 200 and annular segments 202. Wide bar 212 is useful in determining in which range movable substrate 214 is angularly disposed. Bars 218, eight in number, travel over plates 208 and annular ring 204, passing over, and in between finger-like projections 206 and 210 for the various locations in which bars 218 may be disposed. Interposed intermediate adjacent bars 218 are sets of eight vernier finger-like bars 220 which are spaced in vernier-like fashion. Finger-like bars 220 cover a distance slightly less than one-half the arc between such adjacent wide bars 218. They are spaced so as to be disposed apart a distance slightly less than one-half the distance separating each adjacent corresponding finger-like elements 206 and 210, as shown in FIG. 14a. It should be noted that vernier bars 220 comprise eight in number, are grouped together, and are located, as a group, closer to one of wide bars 218, than an adjacent wide bar 218. This is so, in order to provide for compound or double scanning of alternate bars 220, as shown in FIG. 13(d).

FIG. 13(d) illustrates the selection of the appropriate sector plate 208, by its juxtaposition with movable conducting bars 218, resulting in a value of 16 counts X sector count being stored. After this is accomplished, a sweep of sequential sector plates 208, located adjacent to the previously selected plate 208, one being on either side of such previously selected sector plate, is accomplished. If Sector II scan reads +1, eight counts are added to the total count achieved during the Sector I scanning. However, if Sector II scan reads −1, then zero is added to the previous total Sector I count. Following these steps, a Vernier I measurement is made of four sectors spaced so as to skip the first sector immediately adjacent the bar 218 in use, and avoid reading the last two sector plates, intermediate and adjacent the next bar 218, so as to readout the highest capacitance obtained with protrusions 206 and 210. A count of zero, two, four or six is added to the previous total counts, depending upon which of the plates of protrusions 206 and 210 have the maximum capacitance reading. In effect, it is two counts times the sector count of zero, one, two or three protrusion scanned. Finally, an additional sweep is made, in the Vernier II mode, of finger-like protrusions 206 and 210, by reading the next highest and the next lowest vernier readout, for the vernier previously obtained. If a +1 or next highest pair of finger-like protrusions or conducting elements has the highest capacitance, then a count of one is added to the total previous counts. If a maximum capacity is obtained on the finger-like protrusion pair lower than the selected pair of finger-like protrusions, a count of zero is added. Every sector, defined by sector plates 208, can be measured in the vernier sense, to the nearest sector plate for 16 counts per sector plate counted. It should be noted that the sector labeled −1, in FIG. 13(d), for Sector II and Vernier II each refer to a sector or finger-like protrusions pair located immediately preceding the sector or finger-like protrusion pair previously selected as having maximum capacitance with the associated movable bar or vernier strips, when proceeding in a fixed direction away from the sector plate indicating the maximum capacitance with bar 218, such as in a clockwise direction. While utilizing such selected vernier location, and by reading one sector above and one sector below the selected vernier, in the vernier sense again, an additional count of eight or zero is added. The Vernier I count phase adds zero, two, four or six counts to the previously totaled counts and the Vernier II step adds either one or zero to the previous counts. Finally, the range count is multiplied by 128 counts and added to the previously achieved total, utilizing arcuate plates 202 and ring 200, from eight such ranges. A maximum count of 128 is achievable before taking into account the range counting which by itself has the potential to measure 896 counts or 128×7 ranges. Zero represents zero degrees, while a total count of 1023 represents 359.64844°. In the described binary system ($2^{10}$) the resolution achieved represents 0.35156 degrees. I have successfully constructed an apparatus, utilizing 4096 total counts per measurement ($2^{12}$) which yields a resolution of 0.08789 degrees. It should be obvious to those skilled in the art that sequential scanning or sweeping or the selection of the sequence of capacitance measurements, can be at many selected locations, as preferred, in the clockwise or counter-clockwise directions or, in diverse rotational directions, for portions or the entirety of sweeps, as desired.

Though the capacitance measuring portion of the present invention has been described as being useful in making angular measurements, the identical circuitry and construction, save for the design of the capacitance measuring elements, may be employed when making linear measurements, as well. Linear measurements can be accomplished, if desired, utilizing the circuitry employed, as shown in FIG. 10. The sensor element, depicted confined within dotted lines 138, shown in FIG. 10, may replace a circular, or angular measurement device, such as shown in FIG. 8, by a linear capacitance measurement device, not shown. Such linear capacitance measurement device may include a stationary insulating plate member, comprising, say a twelve inch flat strip. Such strip would bear one elongated 12 inch long electrically conductive strip element and one range-like conducting element, disposed along the longitudinal axis for each successive inch thereof, and a plurality of sub-plates. similar to plates 22, shown in FIG. 2, disposed at one-eighth inch intervals, for the first inch. The second inch would include another set of eight plate-like conducting elements 22, being disposed electrically in parallel with equivalent plates 22, for the first inch. This process would be repeated for each successive number of inches comprising the twelve inch ruler. A moving element, say, one inch in length or so, having electrically conductive bars thereon, one sector and nine fine bars, would be disposed over ony inch length of the basic twelve inch scale. Thus, there would be eight conductors for each of the one-eighth inch plate elements and twelve representing the measurement of each successive range elements, for the equivalent inch locating devices, similar to arcuately shaped strips 52, 54 and 56, as shown in FIG. 5, as well as one additional lead for the counter strip. No other leads need by employed for a linear measuring device, of the form described, which would read out zero to twelve inches, with an accuracy equal to one-tenth of an eight of an inch or approximately ten/one-thousandths of an inch. The circular or angular measurement device, suitable for compass purposes or the like, employs sixteen leads and reads out to an accuracy of 1°. It should be noted that there are no moving contacts, nor are there switching contacts employed. Of great importance is that the accuracy of measurement is insensitive to long-term variations in resistance, capacitance and the like, and is sensibly independent of minor circuit variations caused by etching, inter-element capacitance, stray capacitance, humidity, and the like. Since the circuit is strobed many times each second, only changes that occur within a very short time interval will be reflected as an error in the readout. The low mass of the moving component results in a fast reading apparatus which is insensitive to overshooting and undershooting, as well as being useful in measurement devices which are operable on the application of small forces.

If it is desired to measure velocity of rotation, utilizing the angular measurement embodiment, or in the measurement of linear velocity utilizing the linear measurement embodiment of the present invention, an accurate time interval may be generated by adding a separate accurately controlled oscillator, such as a crystal controlled device, well known in the art. Output readings from the present invention may be taken at fixed intervals and the difference between any two successive readings can supply an output reflecting measurement of velocity. Such velocity measurement could be as accurate as the crystal controlled oscillator is capable of maintaining a fixed frequency. Thus, the velocity output terminal generated in this fashion would produce an output that can be expressed in degrees per unit time, such as per second or the like, or, in the case of the linear measurement embodiment, the velocity output may be expressed in inches per second or the like.

It may be highly desirable to utilize two or more sensing devices, each being confined within dotted lines 138, in FIG. 10, in alternate sequential measurement time periods, as in the case of an X-Y plotter or as in the case of a rectangular coordinate "mouse", useful in determining the absolute position on an X-Y coordinate system. A time-sharing technique may be accomplished by adding additional sets of transmission gates or, as shown in FIG. 12, additional sets of nand gates, each coupled to its own sensor apparatus. A set of nand gates, utilizable with each sensor would be activated sequentially alternately with the other set of nand gates, so as to employ the same RC oscillator (block 156-FIG. 10) and all other elements of the apparatus shown in FIG. 10, save for the fact that two sensors are employed and save for the consideration that each sensor would be alternately sequentially energized for alternate time periods. The display, comprising blocks 142, 144, 146 and 148 could be deleted, such that the output of block 150 would be separated into two sequential signals, when being fed into a computer capable of sequentially analyzing the X and Y data. In this fashion, the same electronic circuitry, substantially as shown in FIG. 10, can be employed with two or more sensors with a resultant cost saving in equipment and power consumption.

An electronic vernier apparatus utilizes a pair of insulating substrates, which are positioned so as to have opposed surfaces spaced apart from one another. Both surfaces are arranged such that they may be moved, relative to one another, such that the elements carried by the surfaces may be translated in position. The elements carried on one of such surfaces include an elongated conducting strip as well as a plurality of electrically conducting plates. Each of the plates and the elongated conducting strip are insulated from one another. In addition to the plurality of electrically conducting plates, a plurality of conducting elements are carried on the same substrate, such that one of the plurality of conducting elements is electrically connected to, or forms a part of, each of the plurality of plates. The other surface carries a plurality of conducting bars that are disposed spaced apart from one another, as well as an elongated conducting bar. The elongated conducting bar and the plurality of conducting bars are not coupled to each other. The elongated conducting bar is configured so as to have portions thereof juxtaposable over at least a portion of the elongated conducting strip and portions of each of the plurality of plates. The plurality of conducting bars are configured to have portions thereof each juxtaposable over portions of the elongated conducting strip and portions of each of the plurality of conducting elements. The opposed surfaces of all conducting elements, of all types, be they on the first surface or the other surface, are arranged so as to be in non-coupled relationship relative to opposed conducting surfaces. A dielectric material may be included between the opposed surfaces of all conducting elements so as to reside intermediate both surfaces. A plurality of switching means devices are coupled to the first plurality plates and the conducting strip, so as to selectively couple each of said plurality of plates and the conducting strip to the input of an oscillator means, one plate at a time, reflecting the capacitance measurable between the elongated conducting bar and portions of the conducting strip and each of the plurality of plates. The same plurality of switching mean elements are utilized to couple each of the plurality of plates and their associated conducting elements to the input of the oscillator means by way of measuring the maximum capacitance measurable by a selected one of the plurality of conducting bars disposed juxtaposed over one of the conducting elements and partially disposed over one of the first plurality of plates. The oscillator includes means to vary the frequency of output thereof in accordance with the capacitances measured between each of the plurality of plates in the conducting strip and each of the conducting elements and portions of the conducting strip. The output of the oscillator includes output frequency detection means adapted to identify which one of the plurality of plates makes the maximum value of capacitance with the elongated conducting bar. Similarly, the output detection means of the oscillator is adapted to identify which of the conducting elements makes a maximum capacity with one of the plurality of conducting bars. The apparatus further includes an output signal generating means which identifies the previously detected one of the plurality of plates and the previously detected one of the plurality of conducting elements, so as to generate output signal information reflecting such identification. The apparatus further includes means to proportion the output so as to reflect the output of one of the plurality of conducting elements making the maximum value of capacitance with the elongated conducting strip so as to have a fractional value of the output signal related to the identified one of the plurality of plates wherein such proportionated output signals reflects a vernier-like relationship effectively determining the position of both surfaces. Another plurality of conducting elements may be provided, coupled to each other and to the elongated conducting strip. Another plurality of plates may be employed carried on the same surface as the first plurality of plates is carried, which other plurality of plates may be connected, in pair-like fashion, to individual plates of the first plurality of plates. If desired, the elongated conducting strip may be fabricated so as to have an annular shape with the first plurality of plates being positioned in a circular pattern relative to the elongated annular conducting strip. In this configuration, the plurality of conducting elements may be disposed in radial-like fashion so as to extend outwardly from the annularly shaped conducting strip, and the second plurality of conducting elements may be disposed in radial-like fashion so as to extend inwardly from the innermost marginal edges of the pluralities of plates positioned in circular-like fashion. Both sets of conducting elements may be aligned so as to be extended coaxially. The plurality of conducting segments may be employed and carried on one of the surfaces. If desired, the conducting segments may be disposed in a circular pattern so as to permit the elongated bar to have at least portions of it extend juxtaposable over the conducting segments. In any event, the elongated bar may be configured to have at least portions of it juxtaposable over the first plurality of plates and at least portions of the conducting strip. Similarly, the plurality of bars may be configured to have at least portions thereof juxtaposable over at least portions of each of the first pluraliy of elements and each of the second plurality of elements. More than one elongated conducting strip might be carried on the same surface carrying the elongated conducting strip. More than one elongated conducting bar may be carried on the same surface carrying the elongated conducting bar. The apparatus may be provided with means to electrically decouple the oscillator from one or more of the plurality of the plates, including, but not limited to, decoupling at least one of the first plurality of plates that is located adjacent to the location of the elongated bar, for any location thereof. More than one elongated bar may be employed, in addition to the one elongated bar, such that the plurality of elongated bars are disposed spaced apart from one another and are juxtaposable over portions of the first plurality of plates and at least a portion of the elongated conducting strip. The oscillator may be coupled to all but at least one pair of the plurality of bars where the pair of the plurality of bars are located adjacent opposed marginal edges of the elongated conducting bar. One or more counters may be employed to detect the oscillator output frequency. The plurality of bars may be positioned so as to be separated a smaller or greater distance than the distance separating each of the first plurality of plates. Thhe oscillator output signal generating means may include providing a signal which is in binary code. Some, but not all of the first plurality of plates may be alternately and selectively coupled to the oscillator. Similarly, the output frequency detection means may include means to alternately, selectively couple some, but not all, of the conducting elements to the oscillator.

It is obvious that other forms of sensing the positional relationship between the substrates or structures carrying the disclosed conducting elements may be utilized. Stationary inductors may have their inductance value differ because of the proximity of magnetic or paramagnetic materials, carried on the opposed substrate; the measurement of resistance, such as measurable in a resistive slurry disposed between conducting elements carried on opposed structures; photodiodes, operating in conjunction with mirrors on the opposed structure; and a host of other well known positional/proximity detectors, of the electronic or optical variety may be utilized to detect a range calculation, as well as the vernier measurement, in fractional form relative thereto. The oscillator means described herein need not be limited to an RC oscillator, but can include multivibrators, LC oscillators of many varieties, amongst others, also known in the art.

Thus, there is disclosed in the above description and in the drawings, embodiments of the invention which fully and effectively accomplish the objects thereof. However, it will become apparent to those skilled in the art, how to make variations and modifications to the instant invention. Therefore, this invention is to be limited, not by the specific disclosure herein, but only by the appending claims.

The embodiments of the invention in which an exclusive privilege or property is claimed are defined as follows:

I claim:

1. An electronic vernier apparatus comprising a first substrate, a second substrate, said first substrate having a first surface, said second substrate having a first surface, said first surface of said first substrate being disposed in opposed spaced apart juxtaposable relationship with said first surface of said second substrate, said first surface of said first substrate carrying at least one elongated conducting strip thereon, said first surface of said first substrate carrying a first plurality of electrical conducting plates thereon, said first plurality of electrical plates being electrically decoupled one from another and from said at least one elongated conducting strip, said first surface of said second substrate carrying at least one elongated electrically conducting bar thereon, a first plurality of conducting elements, each of said first plurality of conducting elements being carried by said first surface of said first substrate, a plurality of conducting bars, said plurality of conducting bars being disposed in spaced apart relationship and carried on said first surface of said second substrate, said at least one electrically conducting bar and said plurality of conducting bars being disposed in noncontacting relationship with each other and with said at least one elongated conducting strip and said first plurality of plates and said first plurality of conducting elements, means to dispose opposed surfaces of said at least one elongated conducting strip and said first plurality of plates and said first plurality of conducting elements a fixed distance apart from opposed surfaces of said at least one bar and said plurality of conducting bars, a plurality of switching means elements, at least one of said plurality of switching means elements being coupled to at least one of said first plurality of plates, means to vary the juxtaposition of said second surface relative to said first surface, oscillator means, means to sequentially vary the frequency of output of said oscillator means as a function of a series of first capacitances measurable between said portion of at least one conducting bar and said at least portions of said at least one conducting strip and selectively each one of said first plurality of plates, means to alternatively sequentially vary said frequency of output of said oscillator means as a function of another series of second capacitances measurable between said portion of said one of said plurality of conducting bars and at least a portion of one of said first plurality of conducting elements, oscillator output frequency detection means for identifying which one of said first plurality of plates makes a maximum value of capacitance of one of said series of first capacitances and for identifying which one of said first plurality of conducting elements makes another maximum value of capacitance of one of said series of said second capacitances, oscillator output signal generating means for generating sequential output signals, one of said output signals carrying information identifying said one of said plurality of plates making said maximum value of capacitance, another one of said output signals carrying information identifying said one of said first plurality of conducting elements making said another maximum value of capacitance, means to fractionally proportion said one of another output signals relative to said one of said output signals in vernier-like relationship.

2. The apparatus as claimed in claim 1 further comprising a second plurality of conducting elements, said second plurality of conducting elements being in non-coupled relationship with said first plurality of conducting elements and being carried on said first surface of said first substrate, at least a portion of each of said second plurality of conducting elements being capacitively coupleable to each of said plurality of conducting bars.

3. The apparatus as claimed in claim 1 wherein each of said first plurality of conducting elements are electrically coupled to said elongated conducting strip.

4. The apparatus as claimed in claim 2 wherein each of said first plurality of plates having one of said second plurality of conducting elements being electrically coupled thereto.

5. The apparatus as claimed in claim 1 wherein said plurality of conducting bars are electrically insulated from said at least one elongated bar.

6. The apparatus as claimed in claim 1 further comprising a second plurality of plates, said second plurality of plates being carried on said first surface of said first insulated substrate, at least one of said second plurality of plates being electrically coupled to at least one of said first plurality of plates.

7. The apparatus as claimed in claim 2 further comprising a dielectric material, said at least one electrically conducting bar and said plurality of conducting bars being separated by said dielectric material from said at least one elongated conducting strip and said first plurality of plates and said first and second plurality of conducting elements.

8. The apparatus as claimed in claim 7 wherein said dielectric material comprises a solid.

9. The apparatus as claimed in claim 7 wherein said dielectric material comprises a liquid.

10. The apparatus as claimed in claim 1 wherein said first and said second surfaces are configured to be disc shaped, at least one conducting strip comprises an annular shape, said first plurality of plates being disposed in a circular pattern about the origin of said at least one conducting strip, said at least one conducting strip having a marginal edge thereof having a different radius than a radius defining said circular pattern.

11. The apparatus as claimed in claim 10 wherein said first plurality of conducting elements are disposed in radial-like fashion from adjacent aligned marginal edges of each of said first plurality of plates.

12. The apparatus as claimed in claim 2 wherein said second plurality of elements are disposed extending in a radial-like fashion from a marginal edge of said at least one conducting strip.

13. The apparatus as claimed in claim 2 wherein at least one element of said first plurality of conducting elements and at least one opposed element of said second plurality of conducting elements are disposed in co-extensive axial alignment.

14. The apparatus as claimed in claim 1 wherein each of said plurality of bars are disposed in equal spaced-apart stepped relationship.

15. The apparatus as claimed in claim 1 wherein the distance separating the center of at least a pair of adjacent said plurality of bars is different from the distance separating the center of at least a pair of adjacent said first plurality of plates.

16. The apparatus as claimed in claim 1 further comprising a plurality of conducting segments, said plurality of conducting segments being carried on said first surface of said first substrate, said plurality of conducting segments being disposed electrically decoupled from one another.

17. The apparatus as claimed in claim 16 wherein said plurality of conducting segments are disposed in a circular pattern electrically insulated one from another.

18. The apparatus as claimed in claim 1 wherein said at least one elongated bar is configured to have at least portions thereof juxtaposable over at least portions of each of said first plurality of plates and at least portions of said at least one conducting strip.

19. The apparatus as claimed in claim 1 wherein each of said plurality of bars are configured to have the lengths thereof juxtaposable over at least portions of each of said first plurality of conducting elements and the adjacent one of each of said second plurality of conducting elements.

20. The apparatus as claimed in claim 17 wherein at least another portion of said at least one elongated bar is juxtaposable over at least portions of each of said plurality of conducting segments.

21. The apparatus as claimed in claim 1 further comprising another elongated conducting strip being carried on said first surface of said first substrate.

22. The apparatus as claimed in claim 21 comprising another elongated conducting bar, said another conducting bar being carried on said first substrate of said second surface, at least portions of said another elongated conducting bar being juxtaposable over portions of said another elongated conducting strip and portions of each of said plurality of conducting segments.

23. The apparatus as claimed in claim 2 wherein said means to sequentially vary the frequency of output of said oscillator comprises first means to individually selectively sequentially couple each of said first plurality of plates and one of said at least one conducting bar to said oscillator means and second means to selectively sequentially couple one of said first and said second plurality of conducting elements to said oscillator means exclusive of all others of said first and said second plurality of conducting elements.

24. The apparatus as claimed in claim 23 wherein said means to sequentially vary the frequency of output of said oscillator means further comprises means for electrically decoupling from said oscillator means an adjacent one of said first plurality of plates disposed adjacent to the location of said at least one elongated bar.

25. The apparatus as claimed in claim 1 wherein said at least one elongated bar comprises a plurality of elongated bars, said plurality of elongated bars disposed spaced apart from one another and having portions thereof juxtaposable over portions of said first plurality of plates and portions of said at least one conducting strip.

26. The apparatus as claimed in claim 25 wherein said means to sequentially vary the frequency of output of said oscillator means comprises decoupling from said oscillator means at least one of a pair of said plurality of bars that are disposed adjacent at least two opposed marginal edges of said elongated conducting bar.

27. The apparatus as claimed in claim 1 wherein said oscillator output frequency detection means comprises a counter.

28. The apparatus as claimed in claim 1 wherein the distance separating adjacent ones of said plurality of bars is configured to be a lesser distance than the distance separating adjacent ones of said first plurality of plates.

29. The apparatus as claimed in claim 1 further comprising said oscillator output signal generating means comprising means to generate said output signal in binary code.

30. The apparatus as claimed in claim 1 wherein said output frequency detection means comprises means to selectively alternatively couple each of a sub-plurality of said first plurality of plates to said oscillator means.

31. The apparatus as claimed in claim 1 wherein said output frequency detection means comprises means to selectively alternatively couple a sub-plurality of said first plurality of conducting elements to said oscillator means.

32. The apparatus as claimed in claim 1 wherein said oscillator means comprises an RC oscillator.

33. The apparatus as claimed in claim 1 wherein said plurality of switching means comprises at least one nand gate.

34. The apparatus as claimed in claim 1 wherein said plurality of switching means comprises at least one transmission gate.

35. The apparatus as claimed in claim 2 comprising each of said plurality of conducting bars being configured to be juxtaposable only over portions of selectable and adjacent pairs of conducting elements of said first plurality of conducting elements and of said second plurality of conducting elements.

36. The apparatus as claimed in claim 1 wherein the center distance separating a pair of adjacent first conducting elements is greater than the center distance separating a pair of adjacent conducting bars.

37. The apparatus as claimed in claim 1 wherein said first and said second surfaces are insulators.

38. The apparatus as claimed in claim 1 wherein said first surface and said second surface are portions of first and second right angle cylinders, said first and said second cylinders being coaxially aligned, wherein said first cylinder has at least a portion of the exterior surface thereof disposed within a portion of the exterior surface of said second cylinder.

39. An electronic vernier apparatus comprising a pair of structures, each of said pair of structures having first and second surfaces disposable a fixed distance apart and adjacent to one another, a first plurality of elements disposed on said first surfaces an elongated conducting strip disposed on said first surface and in a stationary non-contacting relationship with said first plurality of elements, a second plurality of elements disposed on said second surface, means to translate said first plurality of elements relative to said second plurality of elements, altering the capacitive relationship between at least one of said first plurality of elements and said elongated conducting strip, at least a sub-plurality of said first plurality of elements being spaced in vernier scale-like relationship relative to said remainder of said first plurality of elements, oscillator means for producing output signals, means for electrically varying said output signals as a function of the instantaneous relative location of said first and said second plurality of elements, said means for varying comprising means for controlling said output signals as a function of the location of said first and said second plurality of elements, wherein said output signals comprise signal information reflecting the translation of said sub-plurality of first plurality of elements in vernier relationship and in non-vernier relationship to said remainder of said first plurality of elements to said second plurality of elements.

* * * * *